United States Patent [19]

Grimes et al.

[11] Patent Number: 4,764,925
[45] Date of Patent: Aug. 16, 1988

[54] METHOD AND APPARATUS FOR TESTING INTEGRATED CIRCUITS

[75] Inventors: Scott D. Grimes, Titusville; Lary J. Beaulieu, Cocoa; Douglas A. Reed, Titusville, all of Fla.

[73] Assignee: Fairchild Camera & Instrument, N.Y.

[21] Appl. No.: 620,736

[22] Filed: Jun. 14, 1984

[51] Int. Cl.$^4$ .............................................. G06F 11/00
[52] U.S. Cl. ........................................ 371/20; 371/25; 324/73 R
[58] Field of Search ................... 364/900, 200; 371/16, 371/20, 27, 25, 21, 15; 324/73 R, 73 AT, 73 PC

[56] References Cited

U.S. PATENT DOCUMENTS

| | | | |
|---|---|---|---|
| 4,481,627 | 11/1984 | Beauchesne | 371/20 |
| 4,497,056 | 1/1985 | Sugamore | 371/20 |
| 4,500,993 | 2/1985 | Jacobson | 371/20 |
| 4,517,661 | 5/1985 | Graf | 371/20 |
| 4,538,268 | 8/1985 | Pham Van Cang | 371/20 |

Primary Examiner—Michael R. Fleming
Attorney, Agent, or Firm—Ladas & Parry

[57] ABSTRACT

A processor controlled IC component test apparatus adapted to be employed in-line with automatic IC DIP component handling equipment is capable of conducting a preselected verification check of each IC device regardless of the orientation of the DIP in the device contact receptable of the IC handling apparatus. As each device under test (DUT) is inserted into the apparatus test head, a pin-check residual voltage measurement test is conducted to ensure that all the pins of the DUT are in contact with the contact terminals of the test head. If the pin-check test establishes that all the pins of the DUT are in contact with the contact terminals of the test head, a prescribed non-destructive impedance measurement test is carried out in order to determine the orientation of the DIP in the test head. If the device passes the orientation test or is determined by the orientation test to be simply misoriented (inserted upside-down), it is then subjected to a prescribed functionality check (with the direction of orientation taken into account).

The processor architecture of the test apparatus is configured to maximize the systems's ability to rapidly sequence through the test vectors for the various DUTs, while also offering the capability to perform traditional CPU functions during the execution of a test. For this purpose, the processor employs a mode-controlled pipelined architecture through which program instructions stored in memory are controllably accessed and processed through either an address-controlled flow path or a data-controlled flow path.

18 Claims, 4 Drawing Sheets

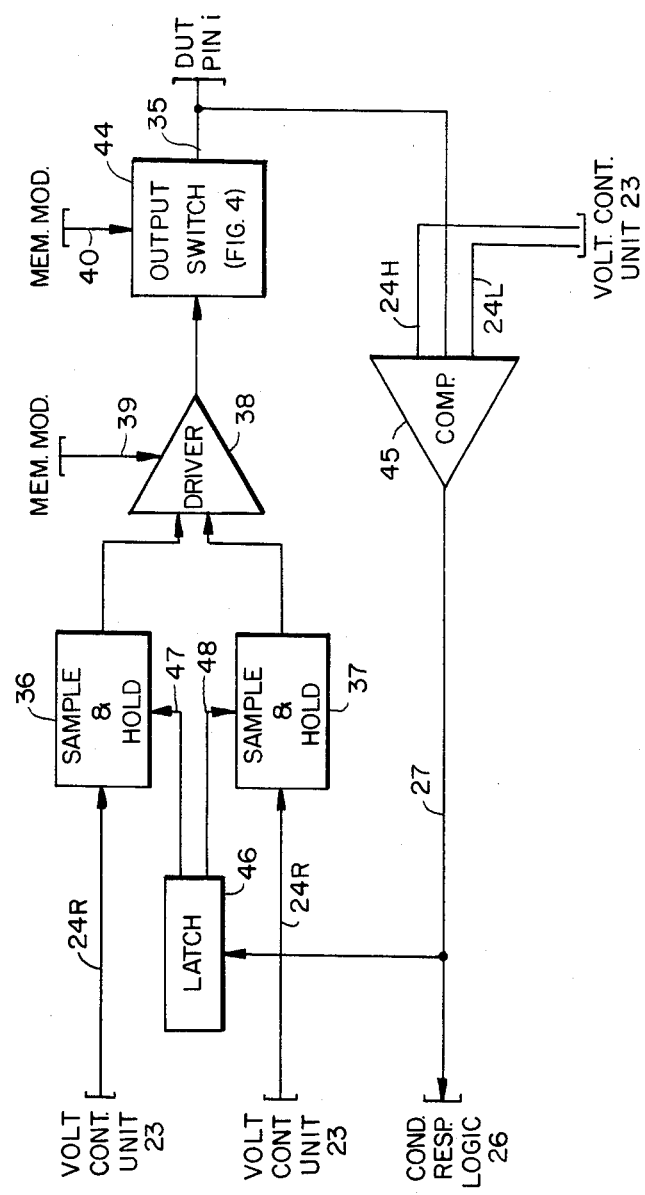

1

METHOD AND APPARATUS FOR TESTING INTEGRATED CIRCUITS

FIELD OF THE INVENTION

The present invention relates to modular circuit testing systems and is particularly directed to an improved scheme for automatically testing the integrity and performance of integrated circuits, such as those packaged as DIP (dual in-line package) components, irrespective of the direction of insertion of the DIP into the contact coupling receptacle (test head) of the testing apparatus.

BACKGROUND OF THE INVENTION

As the packaging density and complexity of integrated circuits continues to increase, the ability to test such circuits becomes a more complicated and time consuming task. Typically, the circuits are packaged as DIPs (e.g. sixteen to sixty-four pin components) which are to be assembled on a printed circuit board as part of an overall system-functional unit. Prior to board assembly, the various DIP components are subjected to a prescribed device verification procedure, usually by way of functional testing via the pin contacts of the DIP. Because each pin contact of the DIP is coupled to a prescribed circuit path within the integrated circuit, proper testing of the circuit requires that the DIP be completely inserted into the contact coupling receptacle of the test apparatus with the proper pin orientation. Moreover, because of the limited time window during which each device is able to be tested in terms of a practical throughput of the testing system, full functional testing has not been generally possible for a number of devices such as LSI components, and large ROMs and RAMs, so that an alternative verification procedure is required.

SUMMARY OF THE INVENTION

In accordance with the present invention there is provided an IC component testing scheme that is adapted to be employed in-line with automatic IC DIP component handling equipment, and which is capable of conducting a preselected verification check of each IC device regardless of the orientation of the DIP in the device contact receptacle of the IC handling apparatus.

Pursuant to the present invention, as each device under test (DUT) is inserted into the apparatus test head, a residual voltage measurement test is conducted to ensure that all the pins of the DUT are in contact with the contact terminals of the test head. In accordance with this pin-check procedure a preselected reference voltage is applied to the power pin terminals of the DUT and each of the other contact terminals is monitored for the presence (within prescribed limits) of a residual voltage. If this pin-check test establishes that all the pins of the DUT are in contact with the contact terminals of the test head (so that the DUT may be subjected to functional testing), a prescribed non-destructive impedance measurement test is carried out in order to determine if the DIP is oriented correctly (i.e. rightside-up) in the test head. If the device fails this test, it may then be subjected to further tests to determine whether the failure is due to misorientation or due to a faulty IC. If the device passes the orientation test or is determined by the orientation test to be simply misoriented (inserted upside-down), it is then subjected to a prescribed functionality check (with the direction of orientation taken into account).

For each of these tests, prescribed processor-controlled voltage levels (e.g. logical high and low levels) are coupled, via respective driver/sensor units, to selected DIP pin contacts, while other pin contacts are monitored (via their associated driver/sensor units) for the presence of prescribed response levels. The presence of a respective response level is typically checked by comparing the monitored pin output with a reference threshold. Because of component errors of the pin driver of a respective driver/sensor unit, which may differ from circuit to circuit and with temperature, the voltage applied via a pin contact to a DUT is subject to variation, so that the output of a pin driver of the driver/sensor unit may be inaccurate. To circumvent this problem, a prescribed calibration procedure is conducted for each pin driver, employing the response comparator associated with the pin of interest, which allows the voltage levels applied by each pin driver to be selectively and individually programmed, thereby eliminating component errors.

In particular, each pin is coupled with a pair of sample and hold circuits that supply reference voltages for the driver's output high and low voltage levels. To define a respective high or low voltage for a particular pin driver, one input of the comparator is programmed by the control processor with a reference level equal to the desired pin voltage, and the input to an associated one (high or low) sample and hold circuit is varied (e.g. ramped) until the output of the sample and hold circuit produces a pin driver output equal to the reference level. When the comparator toggles, the output level of the sample and hold circuit is latched, thereby establishing the reference level that will produce the required pin driver voltage level output.

The pin driver itself comprises a voltage follower type driver, the output of which is brought to a high impedance state by a MOSFET switch coupled at its output. The MOSFET switch has low output resistance and is capable of passing relatively large currents. To turn on the MOSFET, a voltage equal to the turn-on voltage of the MOSFET and referenced (via a Zener diode) to the output of the driver is applied to the MOSFET gate. To turn the MOSFET off, the driver voltage is applied directly to the gate of the MOSFET. The use of this floating switching circuit permits a MOSFET to be used regardless of the voltage range of the driver, thereby overcoming performance and accuracy problems under varying loads and environmental conditions.

As pointed out above, the voltage levels that are supplied to the driver/sensor units in the course of verifying successive DUTs are processor-controlled. Because device verification speed is a significant criterion in measuring the performance of the IC test apparatus, the processor architecture is configured to maximize the system's ability to rapidly sequence through the test vectors for the various DUTs, while also offering the capability to perform traditional CPU functions during the execution of a test. For this purpose, the processor incorporated into the test apparatus of the present invention employs a mode-controlled pipelined architecture through which program instructions stored in memory are controllably accessed and processed through either an address-controlled flow path (mode I) or a data-controlled flow path (mode II). In the mode I, address-controlled flow path, a test vector address generator produces successive address codes, each of which defines an address in the instruction memory from which the next instruction of the test vector sequence is to be accessed, as well as an address in each of respective local memory modules associated with the respective driver/sensor units from which a voltage level-defining data code for the pin of interest is read out to establish a circuit functional parameter at that pin. As each instruction is accessed from memory, the test vector address generator decodes its contents and also examines prescribed system conditions (e.g. pin failure indications) to produce a new address. Namely, in accordance with mode I operation, the test vectors through which a DUT is tested are produced simply by sequencing through a series of addresses, without waiting for a data-based operation to be performed. Thus, the mode I pipelined processing loop is extremely simplified, involving only an address flow path containing the instruction memory and the test vector address generator.

In the mode II, data-controlled pipeline flow path, the generation of addresses for accessing instructions from memory depends upon the results of the manipulation of data (i.e. ALU processing) subsequent to an instruction decode operation. When the system is to operate in this mode, mode I test vector address generation is interrupted and the current address produced by the test vector sequence generator is held or latched until mode II processing has been completed. At that time when the processing flow path is to return to mode I, the previously latched address is employed as a pointer for accessing the next instruction.

Because this processor architecture has the capability of operating in either a data-controlled mode or an address controlled mode, the control processor provides the present invention with complete data manipulation performance when necessary (mode II), yet offers a significant improvement in the speed of testing the integrated circuits over conventional, exclusively data-dependent approaches by establishing a sequence of test vectors through which the integrated circuits are tested through a simplified pipeline flow path (mode I) that effectively minimizes the number of steps required to generate successive addresses and test vectors.

BRIEF DESCRIPTION OF THE DRAWINGS

FIG. 3 is a schematic block diagram of the pin driver/sensor unit 34 of the apparatus shown in FIG. 2;

DETAILED DESCRIPTION

Before describing, in detail, the particular integrated circuit-containing dual in-line package testing system in accordance with the present invention, it should be observed that the invention resides primarily in a novel combination of conventional data storage, signal processing and interface circuit components. Accordingly, the structure, control and arrangement of such components have been illustrated in the schematic diagrams of the drawings by readily understandable block representations which show only those specific details that are pertinent to the present invention, so as not to obscure the disclosure with structural details which will be readily apparent to those skilled in the art having the benefit of the description herein. Accordingly, the block diagram illustrations do not necessarily represent the mechanical structural arrangement of an exemplary test apparatus, but are primarily intended to depict the major equipment components of such an apparatus in a convenient functional grouping whereby the present invention may be more readily understood.

Figure 1:
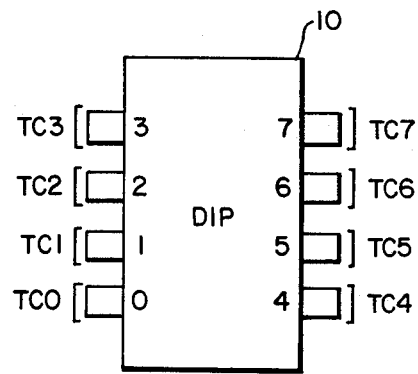
FIG. 1 is a top view of an eight-pin DIP.

Referring now to FIG. 1, there is shown a plan view or a top view of a multi-(eight) pin dual in-line package 10 containing an integrated circuit chip to be tested. As was mentioned briefly above, the present invention is capable of testing multi-pin modular circuit packages of substantially any number of pins, consistent with the signal processing and connector limitations of associated data processing equipment. For currently commercially available components this means that the present invention is adaptable to testing eight to sixty-four pin DIPs. It should be observed, however, that the invention is not limited to this or any other number of pins of the DIP to be tested. This range of pins is simply provided because it represents practical ranges of present day commercially produced modular-housed integrated circuit components. For purposes of the explanation to follow, the explanation of the invention will be considered to apply to a DIP having the eight pin configuration shown in FIG. 1.

As shown therein, on one side of the DIP there are four pins identified by pin numbers 0, 1, 2 and 3, whereas the opposite side of the DIP has a set of four pins corresponding to pin numbers 4, 5, 6 and 7. As will be described below, these pins is adapted to be placed in contact with the respective terminal connectors TC0-TC7 of the test head of the DIP handling apparatus to which the present invention may be coupled for testing the individual integrated circuits.

The handling apparatus itself forms no part of the invention and a description thereof will not be provided, as it is not necessary for an understanding of the circuit structure and operation of the test system of the invention to be interfaced with such test apparatus. Suffice it to say, however, that such test apparatus typically includes a mechanically (usually pneumatic) DIP handling manipulator and a set of one or more DIP feed tubes in which a plurality of DIPs are stacked, one on top of another, and successively fed by way of the handling apparatus to the pin contact test head where the testing of the individual integrated circuits is performed.

Figure 2:
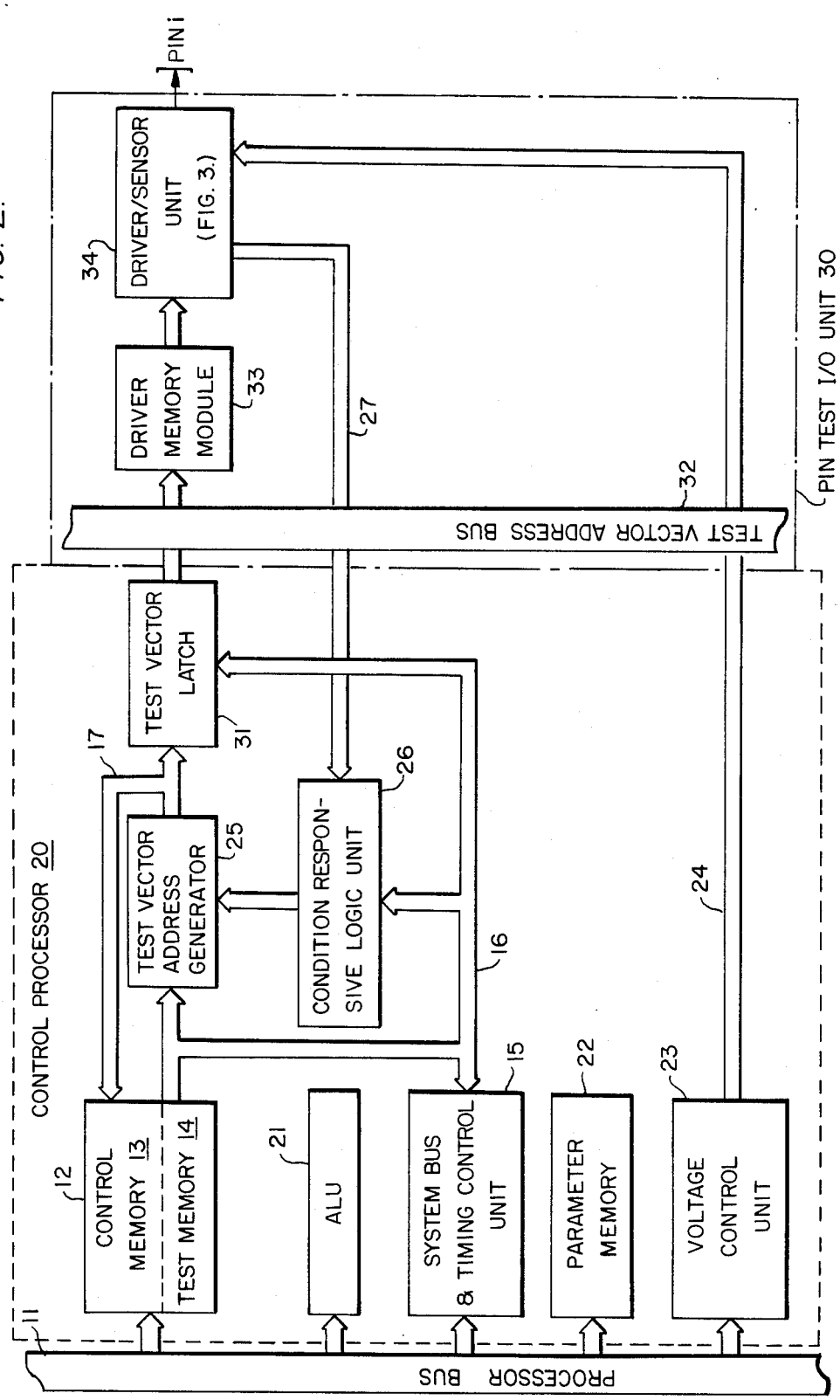
FIG. 2 is a block diagram of an integrated circuit test apparatus according to the present invention.

Referring now to FIG. 2 there is shown a schematic block diagram of the modular circuit test system according to the present invention. As shown therein, the system includes a control processor designated by broken lines 20 and a pin test input/output unit designated by broken lines 30, which interfaces with the control processor 20 for supplying stimulus voltage levels to and monitoring response voltage levels at the individual pins of the test head, whereat the device under test is engaged, for carrying out the various test procedures to be described below.

The control processor 20 is shown as being interfaced with a processor bus 11 which may, in turn, be coupled to a host computer (not shown) from which control programs for operating the processor 20 and the pin test input/output unit 30 are supplied. The details of neither the structure of bus 11 nor that of the host computer are necessary for an understanding of the invention and they will not be described here. Instead, the description of the control processor 20 will focus upon its own architecture and the manner in which that architecture is capable of operating in either of two test modes (i.e. an address responsive mode (mode I) and a CPU/data responsive mode (mode II)) in the course of verifying the acceptability of DIP-housed integrated circuits (hereinafter identified as devices under test (DUTs)).

As shown in FIG. 2, the control processor 20 includes an arithmetic logic unit (ALU) 21 and an associated data (parameter) memory 22, as well as a system bus and timing control unit 15, each of which is coupled to processor bus 11. These architecture components are conventional computer processing and signal coupling units that interface with one another in accordance with present day data processing hardware configuration schemes so that a detailed description thereof will not be provided. One example of such processor architecture is provided by the Motorola 68000 hardware architecture configuration and attention may be directed to such commercially available data processing hardware and/or computer data books explaining the same.

Figure 6:
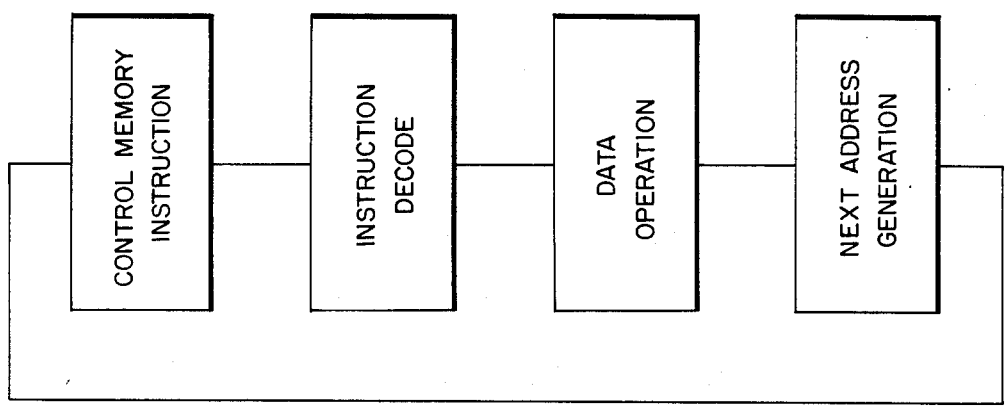
FIG. 6 is a pipeline sequence flow diagram for illustrating the CPU/data-responsive mode of operation (mode II) of the control processor.

Also included within the control processor is a memory unit 12 the address space in which is subdivided into a control memory section 13 and a test memory section 14. Control memory section 13 contains a set of instructions through the execution of which the system is capable of carrying out system control programs such as calibration, loading and on-line diagnostics. The execution of these instructions typically involves the decoding of an instruction, the manipulation of data (i.e. ALU and parameter memory participation) and the generation of the address for the next instruction to be processed based upon the results of the data manipulation step. (A pipeline flow diagram for this mode of operation of the system is shown in FIG. 6, to be described below.) The instructions stored in control memory section 13 are loaded by the host computer via processor bus 11 during system initialization.

Test memory section 14 contains a set of instructions through the execution of which the system is capable of rapidly sequencing through a series of test vectors that access electrical stimulus levels through which an IC is tested. Like control memory section 13, the instructions stored in test memory section 14 are loaded by the host computer via processor bus 11 during system initialization. For a respective pin (test channel) i, a plurality of digital codes corresponding to respective electrical stimulus (voltage) levels are stored in respective memory locations of a driver memory module 33 that is contained within the pin test input/output unit 30. These digital codes are written into this local I/O memory module 33 during the execution of a pretest program that forms part of the instructions stored in control memory section 13.

The generation of the test vectors themselves is carried out by an instruction/condition responsive address generator 25, which is coupled to memory output link 16 and to a condition responsive logic circuit 26. Address generator 25 (which may be a commercially available 2910 microcode sequencer manufactured by AMD Corporation) decodes the contents of an instruction coupled from memory 12 on link 16, together with any system conditional control input supplied by logic circuit 26, and produces therefrom a code corresponding to the address of the next instruction to be executed. This code is coupled to memory 12 over link 17. This code is also coupled via a switchable test vector latch or buffer 31, to a test vector address bus 32 within pin test I/O unit 30, for application to respective drive memory module 33 for each of the pin channels. As mentioned previously, during the address responsive mode of operation of the system, the processor generates a sequence of test vectors for testing an IC. Through the operation of test vector address generator 25, the address codes that are produced on link 17 to access instructions from memory (test memory section 14) are also employed as the test vectors for accessing the digital codes stored in memory 33 through which electrical stimulus levels for testing the IC are produced. Namely, the address of the next instruction in test memory section 14 operates as a test vector. Thus, both test memory section 14 and driver memory 33 respond to the same address produced by generator 25.

As pointed out above, as test vector address generator 25 decodes instructions read out of the test memory portion 14 of memory 12 and generates address signals that are employed for both accessing the next instruction to be executed and for accessing stimulus-representative codes from channel memory 33 within the pin test input/output unit 30, these test vectors (addresses) are coupled through a test vector latch or buffer 31. Latch 31 responds to address space defining bits which form a part of the information conveyed on link 16 and indicate from which section in memory 12 an instruction is being accessed. As long as the instructions are being accessed from the test memory section 14, latch 31 continues to successively buffer each new address generated by address generator 25, thereby permitting the address codes produced by test vector address generator 25 to be successively coupled to test vector address bus 32 for application to each of the driver memory modules 33 for the respective channels of pin test input/output unit 30. If the address code produced by test vector address generator 25 corresponds to an address which is not located in test memory section 14, but is rather located in control memory section 13, whereby the sequencing through successive test vectors is interrupted and the processor changes its operation from mode I to mode II, the last address code produced by generator 25 which is currently buffered in test vector latch 31 is held or latched therein as a pointer to the next address which will be accessed when the branched mode II data-responsive operation currently being conducted has been completed.

Condition responsive logic circuit 26 comprises a set of combinational logic which monitors prescribed conditions within the system and couples indications of the same as flags to the conditional inputs of test vector address generator 25. For example, the existence of a failure condition on one of the pins of the device under test, as coupled over link 27 from a respective driver sensor unit 34, will cause condition responsive logic circuit 26 to so advise address generator 25. The detection of a failure inhibits further testing by causing address generator 25 to abort further access to the test memory 14 and generate an address which references an exit routine contained in control memory section 13.

Also included within the control processor 20 is a voltage control unit 23 which is coupled over link 24 to driver sensor unit 34 within the pin test input/output unit 30. Voltage control unit 23 may include programmable DAC (digital-analog converter) circuitry which responds to voltage setting control data on bus 11 and supplies a corresponding analog voltage over link 24 to each of the driver/sensor units 34 within the pin test input/output unit 30. As mentioned briefly above, one of the features of the present invention is its ability to effectively calibrate out component errors in the pin driver components through which electrical stimulus levels are supplied for testing individual pins of a DUT. Voltage control unit 23 is employed to supply ramping voltages that are used in this calibration procedure. The manner in which voltage control unit 23 interacts with sample and hold and comparator circuitry of driver/sensor unit 34 will be described in greater detail below with reference to FIG. 3.

As pointed out above, pin test input/output unit 30 includes a plurality of driver memory modules 33 and associated driver/sensor units 34, one for each pin for a device capable of being tested. In FIG. 2, only an individual driver memory module 33 and an individual driver/sensor unit 34 forming part of a respective test channel i for a pin i of a DUT have been shown. It should be realized, however, that pin test input/output unit 30 comprises a plurality of such units, corresponding to the number of pins of the test head to which the device under test is to be coupled. Thus, for a test head capable of testing a 64 pin DIP, distributed along test vector address bus 32 will be an additional 63 driver memory modules 33 and associated driver/sensor units 34. The voltage levels on the respective pins that are monitored by the sensor units (comparators) within the driver/sensor units 34 produce pin test response levels that are coupled over a multiplexed bus 27 to condition responsive logic circuit 26, referenced above. Thus, for a 64 pin device, there will be associated multiplexer circuitry (not shown) through which link 27 is coupled from the individual driver/sensor units 34 to link 27. The illustration of such multiplexer circuitry has been omitted from FIG. 2 for purpose of clarity.

Referring now to FIG. 3, driver/sensor unit 34 is shown as comprising a pair of sample and hold circuits 36 and 37, which are respectively coupled to a ramp coupling portion 24R of output link 24 from voltage control unit 23 within the control processor 20 of FIG. 2, described above. Link 24R couples a controllable ramp voltage generated by a programmable DAC within the voltage control unit 23 of control processor 20. This ramp voltage is employed to establish the necessary threshold by way of which an accurate setting of a prescribed electrical stimulus (voltage) level may be applied to a respective terminal pin of a DUT. Sample and hold circuit 36 is employed for establishing the upper threshold (i.e. for setting a logical high level for testing the integrated circuit), whereas sample and hold circuit 37 is employed for establishing a lower threshold voltage (for applying a logical low level for testing the integrated circuit). The output of each of sample and hold circuits 36 and 37 is coupled to an amplifier driver circuit 38, the output of which is coupled over link 43 to a pin driver output switch 44 (the details of which will be described with reference to FIG. 4 below). Switch 44 is coupled to output pin line 35 which supplies an analog voltage level or stimulus to a respective terminal pin of the test head for application to a pin contact of a DUT that has been inserted into the test head by the DIP handling apparatus. Pin line 35 is also coupled as an input to comparator 45.

Comparator 45 is employed to monitor the output produced by the DUT at the pin associated with the channel of interest. Typically, comparator 45 compares the voltage on pin line 35 with an upper or a lower threshold on one of links 24H and 24L, respectively and supplies a pass or fail output (depending upon whether or not the threshold was exceeded) on link 27 for application to processor 20, as mentioned previously. In accordance with the present invention, comparator 45 is also employed for calibrating each test channel (specifically pin driver amplifier circuit 38) so as to insure that prescribed high and low logic levels may be selected applied to the pin of interest for properly testing the integrated circuit. For this purpose, output link 27 from comparator 45 is coupled to a latch 46. Latch circuit 46 has a pair of outputs coupled over links 47 and 48, respectively, which are employed to cause sample and hold circuits 36 and 37 to hold or maintain the voltage applied thereto at the time that latch circuit 26 is triggered by a toggle signal on link 27 from comparator 45.

Driver/sensor unit 34 also includes an additional pair of processor-based control inputs for selectively enabling specific circuit components within the driver/sensor unit. Specifically, input link 39 from driver memory module 33 is coupled to pin driver amplifier 38 to selectively cause driver amplifier 38 to drive output line 43 with either the logical high voltage from sample and hold circuit 36 or the logical low voltage stored in sample and hold circuit 37. An input 40 from memory module 33 selectively enables a driver output switch 44 for coupling the output of pin driver amplifier 38 on link 43 to output line 35 of the driver sensor unit for application to the pin of interest of the DUT.

Operation

Driver/sensor unit 34 operates in one of three modes: 1—calibrate mode; 2—sense mode; and 3—drive mode.

Calibrate Mode

As pointed out previously, one of the significant advantages of the present invention is its ability to compensate for component errors in the driver amplifier circuitry through which respective logic levels are applied for testing the integrated circuit. These component errors will vary from driver to driver and over temperature. Typically a pair of logic level voltages (e.g. +5 volts for a logical 1 and 0 volts for a logical 0) are selectively applied by way of a pin driver to a terminal contact on the test head for testing the integrated circuit. If these logic voltages were hardwired, differences in the parameters of the components of the driver circuits for the plurality of channels would negatively impact on the accurate testing of the DIPs. In accordance with the present invention, however, the voltage error introduced by component variations in each respective pin driver amplifier is effectively compensated by a calibration technique which establishes the requisite DC voltage for the logic level that will produce the desired output voltage to be applied at the pin to the integrated circuit.

For establishing the prescribed high voltage level for the pin (e.g. +5 volts=logical 1), a high reference level voltage (+5 V) is coupled over link 24H to the high reference input of comparator 45. A ramp voltage is then applied from voltage control unit 23 over input link 24R to sample and hold circuit 36. The ramp voltage typically begins in the neighborhood of the upper or high threshold voltage, taking into account a predictable range offsets through the circuitry components of the sample and hold circuit 36, the pin driver 38 itself and output switch 44. In this mode, output switch 45 directly connects the output 43 of pin driver 38 to pin line 35. As the input voltage supplied to link 24R continues to ramp up, comparator 45 monitors the voltage on line 35, which tracks the input voltage ramp on link 24R, but is displaced therefrom by the DC offset through the circuit components in the series path from link 24R to pin line 35. For a typical high logic voltage level of +5 V for present day integrated circuit components, the voltage drop or displacement may be on the order of 1.5 volts so that ramp voltage 24 may begin a positive swing in the neighborhood of approximately 3.5 volts. Eventually, the ramp voltage on link 24R will increase to a value corresponding to the (+5 volt) threshold level coupled over link 24H to the high reference input of comparator 45. When this occurs, comparator 45 toggles, supplying an output over link 27 triggering latch circuit 46. The output of latch 46 is coupled over link 47 to sample and hold circuit 36 to cause sample and hold circuit 36 to maintain or hold its present output voltage at that value which produces a +5 volt high logic level on pin line 35. The ramp on input line 24R continues to increase or ramp up over the prescribed range of values that have been preestablished for operating the circuit. However, the output of sample and hold circuit 36 is maintained at the voltage referenced above. Once this high logic level voltage calibration procedure has been completed, a similar low level calibration procedure is conducted employing sample and hold circuit 37.

Assuming a low logic voltage level of 0 volts to correspond to a logical 0, the ramp on input link 24R may begin in the neighborhood of some negative voltage and track positively towards 0 volts and eventually cross the 0 voltage level. Again, due to the voltage drop through the circuitry of sample and hold circuit 37, driver 38 and output switch 44, there will be some voltage offset between the output on pin line 35 and input link 24R. Comparator 45 compares the ramp voltage on line 35 with the low reference threshold that has been supplied over link 24L and toggles when the two voltage levels match. This causes latch circuit 46 to disable further sampling of sample and hold circuit 37, via link 48, so that sample and hold circuit 37 continues to store a voltage level which causes comparator 45 to trigger when the voltage on input line 35 matches the low voltage level on input line 24L (corresponding to the intended value of 0 volts or a logic low on pin line 35).

It is to be recalled that there is a respective pin driver/sensor unit 34 associated with each of the pins of the test head into which a DIP is to be inserted. For providing the capability of testing up to a 64 pin DIP, the pin test input/output unit 30 will contain 64 driver/sensor circuits, as explained previously. Because the range over which the calibration voltages for the logical high level and the logical low level are ramped is sufficient to encompass component and temperature offsets for each of the 64 driver circuits, it is possible to carry out the calibration procedure for each of the 64 pin driver circuits simultaneously. Namely, at some time during the ramp excursion for each of the respective high and low logic level calibration test, each respective comparator 45 will produce a toggle output over line 27 to effectively store the required voltage levels in sample and hold circuits 36 and 37 which will cause pin driver amplifier 38 to produce the required logic level analog voltage on pin line 35 for that particular channel. As a result, at the end of the calibration interval, wherein both high and low logic level voltages have been established for each pin driver, each driver sensor unit 34 will have stored in its sample and hold circuits 36 and 37, respectively, voltage values that are unique to the particular driver/sensor units for the associated pins, which establish, precisely, high and low voltage levels to be selectively switched to pin line 35 via driver switch 44 during subsequent testing of a device.

Drive Mode

During the drive mode operation of the driver/sensor unit for a respective channel, a selected logic level representative voltage (e.g. 0 volts for a logical low, +5 volts for a logical high) is supplied by pin driver amplifier 38 and driver output switch 44 to pin driver line 35. The selection of the appropriate logic voltage level of interest is controlled by the contents of the location within driver memory module 33 that has been addressed by the test vector generated by test vector address generator 25 within the control processor 20, as explained previously. The selection of a logical high or low is controlled by the state of control line 39 to pin driver 38 which couples the voltage stored in one of sample and hold circuits 36 and 37 through output switch 44 for application to pin line 35. In some instances, pin line 35 is selectively nondriven. In this circumstance, a control signal from the appropriate memory location and driver memory module 33 causes the state of control line 40 to driver output switch 44 to disconnect line 43 from line 35. During the drive mode of a logical high or logical low level, however, a control signal on line 40 causes driver output switch 44 to couple link 43 to pin line 35.

Sense Mode

In the sense mode of operation of the circuit, a programmable reference voltage is supplied to one of links 24H and 24L at the input of comparator 45. Comparator 45 monitors the response voltage coupled over pin line 35 from the DUT, and a supplies pass or fail (logical high or low) over output line 27 to processor 20 depending upon the level of the response voltage. As mentioned briefly above, and as will be explained in detail below, an initial test that is conducted on a DIP is a determination of whether each of the pins of the DIP is in contact with the terminal contacts of the test head. This is accomplished by applying a logical high DC voltage to both power pin terminals of the DIP and then monitoring the residual voltage at each of the other pins of the DIP. On the basis of emperical measurements, the residual voltage that is expected to appear at the respected pins of the DIP, within a prescribed range of tolerances, is measured by comparator 45. As long as the residual voltage falls within the range of tolerances established by the high and low voltage reference levels on links 24H and 24L, the pin of interest is considered to be producing the requisite residual voltage and comparator 45 supplies a pass-representative logical level on output line 27.

Figure 4:
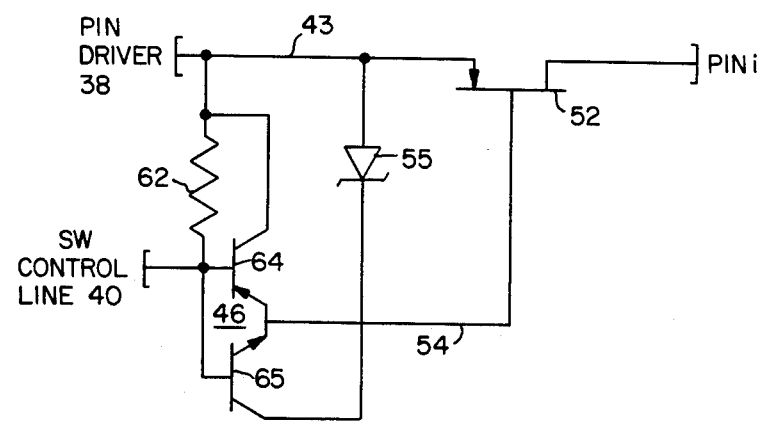
FIG. 4 is a schematic diagram of the pin driver output switch 44 employed in the pin driver/sensor unit of FIG. 3.

The configuration of pin driver output switch 44 is shown in FIG. 4 as comprising a pair of emitter coupled switching transistors 64 and 65, the emitters of which are connected to the gate of an MOS transistor switch 52. Output line 43 from pin driver amplifier 38 is coupled to the collector of transistor 64 and to one terminal of a pull down resistor 62. The other terminal of resistor 62 is connected to the base of each of transistors 64 and 65 and to switch control line 40. The collector of transistor 65 is coupled to one terminal of a reference voltage source (Zener diode) 55, the other terminal of which is coupled to pin driver output line 43. Line 43 is further coupled to the source of MOS transistor 52 while the drain thereof is coupled to pin line 35.

As mentioned previously, the use of an MOS switching transistor permits the output of the driver to be readily placed in a high impedance condition while providing low output resistance and conducting relatively high currents. Because the gate-source voltage of an MOS switching transistor is typically in the neighborhood of 15 volts, a voltage limiting device (here Zener diode 55) is employed between the source connection on pin driver output line 43 and the gate control line 54 to effectively limit the voltage differential across the source-gate path of transistor 52, while permitting transistor 52 to track the output of pin driver 38. In other words, when MOS transistor 52 is switched on, the voltage applied to the gate effectively tracks that of applied to the source except that the differential between the two is limited to the Zener voltage of Zener diode 55.

In operation, for turning transistor 52 on, a turn-on signal supplied to line 40, which effectively turns on transistor 65 and turns off transistor 64. With transistor 65 being turned on, the voltage on line 54 is coupled to Zener diode 55 which limits the differential between the source and gate of transistor 52 by the Zener protection voltage (which is less than the gate source breakdown voltage of transistor 52). This permits the drive stimulus on line 43 from pin driver 38 to be coupled to pin line 35. To switch transistor 52 off, the high level on line 40 changes state to a low level, pulling down the base input to transistor 64, turning on transistor 64. The driver output on link 43 is applied to the gate of transistor 52 turning transistor 52 off.

Thus, because the switching transistor 52 effectively floats, through the interconnection of the above-referenced switch control input and Zener diode 55, an MOS switching transistor can be employed for the active switching element regardless of the voltage range output of the driver.

Test Procedure

As mentioned briefly above, in accordance with the present invention, when a DIP is to be tested, it is placed in the insertion head by the device handling equipment and then initially checked to be certain that each of the pins of the DIP is in contact with the terminal contacts of the test head. (Obviously, if not all contacts are in contact with the test head, the device is incapable of being tested.) Once it has been determined that the device is in contact with the test head, an orientation test is carried out to determine whether the device has been inserted into the test head in a rightside-up (pin #1 of the DIP is aligned with terminal contact #1 of the test head) or upside-down (pin #1 of the DIP is diagonally opposite to terminal contact #1 of the test head) attitude. Typically, the DIPs are contained in a series of handling apparatus insertion tubes through which the DIPs are fed one by one to the test head. Because the physical configuration of the DIPs is symmetrical, it cannot be guaranteed that each DIP is inserted such that its pin numbers correspond to the pin numbers of the test head. In accordance with the present invention, an orientation check is carried out to determine whether the DIP has been inserted right side up or upside down and then, as a result of that orientation test, a functionality test may be conducted in the appropriate direction. Each of these test will be described individually below.

Contact Integrity Test

Before any testing of the DIP can be carried out, it must initially be determined whether or not all of the pins of the DIP are in contact with respective terminal contacts of the test head. According to the present invention, this determination is made by applying a prescribed reference voltage (e.g. a logical level high voltage (+5 volts)) to end terminals of the DIP. Then, the remaining terminals between the end terminals are monitored for the presence of a residual voltage. The comparator has a very high input impedance that permits a residual voltage to be measurable without the applied voltage being large enough to damage the integrated circuit and provides the capability of sensing small magnitude currents in the form of measureable voltages. In this contact integrity test mode, for two of the channels (those for the power pins of the DUT) of pin test input/output unit 30, the driver amplifier 38 will supply a high voltage level to pin line 35 for application to those associated pins of the DIP. The remaining pins of the DIP, associated with the other respective channels of pin test input/output unit 30, are monitored by comparator 45 for the presence of a prescribed residual voltage. This data is supplied over links 27 to the processor 20 to determine whether or not each of the pins is in contact with the test head. Assuming that the DIP is completely connected to the test head, a nondestructive orientation test is next carried out.

Orientation Test

Pursuant to this test, a programmable reference voltage from the driver/sensor unit 34 is coupled through a resistor to one of the end pins of the DIP, while an impedance measurement is conducted across the DIP using the pin terminal at the opposite side and opposite end of the DIP. Specifically, a prescribed low voltage, low current input (e.g. less than two volts and less than 2 milliamps) is applied through a resistor to a selected pin of the DIP. A second pin of the DIP is coupled to a reference voltage (e.g. ground) and the voltage across these pins of the DIP is measured. This voltage measurement is proportional to the impedance across the two selected pins of the integrated circuit. This procedure is then repeated by reversing the DIP pin numbers to which the controlled stimulus and measurement outputs are applied. Namely, a low voltage, low current stimulus is supplied through a resistor to the second pin of the integrated circuit, while the first pin is connected to ground and the voltage across the DIP is again measured. All of the remaining pins of the DIP are left floating. If the relative values of the impedances conducted for the respective measurements with the pin order reversed (i.e. $Z_1 > Z_2$ or $Z_2 > Z_1$) are the same as those of a previously measured known acceptable integrated circuit, the orientation of the integrated circuit is assumed to be right side up. If the relative values are not the same, however, the integrated circuit is assumed to be either bad, the wrong type, or inserted in the wrong direction. By the selection of the pin numbers, a determination of right side up or inverted orientation is readily determinable in accordance with the value of the impedance measurement. If it is determined that the DIP has been inserted with the correct orientation, further functional testing may be immediately performed. If it is determined that the DIP has been inserted up side down, the test file for carrying out functional testing of the DIP supplied from the host computer is placed in the test memory section 13 of memory 12 taking into account the reverse order of the pins. This may be accomplished by storing a duplicate file of the functional test in the host computer with pin designation addresses preestablished for an inverted DIP.

Functionality Test

Once it has been determined that the DIP is in contact with each of the pins of the test head and its orientation has been identified, a prescribed functionality test, selectively applying prescribed stimulus voltages to selected pins of the DIP and measuring responses at selection other pins of the DIP, is carried out. The functionality test verify that the DIP is usable and may be thereafter incorporated as part of the printed circuit board to be assembled.

In the course of conducting each of the above tests and the operation of the system, in general, the control processor 20 receives respective test files from the host computer, initializes its internal memory and the pin driver memory modules, conducts a pretest calibration procedure and then proceeds to test the DIPs as they are inserted into the test head. As was pointed out above, the architecture of the processor of the present invention may operate in either of two modes, one of which is address-responsive and permits test vectors to be rapidly sequenced, and the other of which is data-responsive, so that the processor operates in a conventional data responsive pipeline flow mode.

Figure 5:
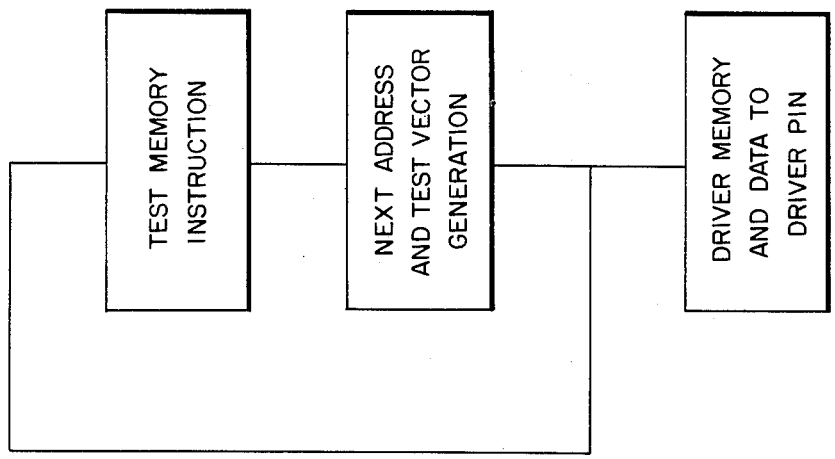
FIG. 5 is a pipeline sequence flow diagram for illustrating the address-responsive mode of operation (mode I) of the control processor.

FIGS. 5 and 6 illustrate the pipeline flow through the architecture of the processor for each of these modes, respectively.

As shown in FIG. 5, when sequencing through test vectors that are accessed from the test memory space 14 within memory 12, address generator 25 decodes the instructions from memory and any conditional inputs supplied over link 27 and produces therefrom an address from which the next instruction is to be accessed from memory. This address also corresponds to an address in each of the local memory modules for each of the channels of pin test input/output unit 20. In response to this address, each local memory module outputs a respective control code that is supplied to the driver sensor unit 34 for selectively coupling a stimulus voltage to the respective pin line 35. As long as the address codes which are generated by address generator 25 access instructions which are contained within the address space of test memory section 14, the above described operations continue to be repeated. This means that the speed of operation in mode I is limited only by the rate at which addresses can be successively generated in a loop path between address generator 25 and memory 12. As the number of steps for producing the next address is considerably reduced relative to a data responsive operation, the speed of each test is considerably enhanced so that the throughput of the test system, in terms of numbers of DUTs per unit of time, is considerably enhanced. In addition, this mode of operation enables the rate of application of test signals to the IC to be maximized.

Of course, it will be realized that in the course of its operation, the processor will occasionally be required to perform control computations that involve the manipulation of data before the address of the next instruction can be calculated. A pipeline flow diagram for this mode operation is illustrated in FIG. 6 which shows that when address generator 25 produces the address of an instruction which lies in control memory selection 13 of memory 12, a data operation is to be performed in response to that instruction decode. As mentioned above, address latch-buffer 31 retains the last address produced by address generator 25 when the address of an instruction references a location in the control memory section 12. When the instruction has been decoded, the necessary data manipulation step has been executed (i.e. an ALU 21 and parameter memory 22 interchange) have been completed, the results of the data operation will provide a basis for the address of the next instruction to be accessed from memory 12. In this mode, the need for computation significantly slows down the rate at which the instructions are accessed from memory 12, as compared with the pipeline flow shown in FIG. 5 wherein test vectors are generated simply by sequencing through successive addresses in test memory section 14 of memory 12.

Thus, while accessing the control memory and carrying out data manipulations is part of the overall operational capability of the system, it is not necessary for generating the addresses for sequencing through test vectors. Instead, as explained above, test vector generation is achieved simply by sequencing through a series of addresses. Since the addresses define the location from which test stimulus inputs are to be accessed for the respective pins of a DUT, and are preestablished during the initialization of the system, the need for computations and thereby data responsive address generation as in the pipeline flow of FIG. 6 are obviated. It will be readily appreciated, therefore, that the switchable pipeline architecture of the processor employed in the present invention permits speed to be maximized for executing test vectors and making branch decisions based upon external tester hardware (conditional inputs through conditional logic circuit 26) when the processor operates in an address responsive mode. On the other hand, during the data-responsive mode of operation, the processor stores the last test vector (generated address) of Mode I operation and is able to perform data-based operations which permit numerical and data transfer functions to be performed. This dual mode capability provides the invention with the ability to test integrated circuits for maximum test vector generation speed while still providing the ability to perform traditional CPU functions during the execution of a test.

While we have shown and described an embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed:

1. An apparatus for testing a circuit device, said circuit device having a plurality of terminal pins through which said device is adapted to be operated in accordance with its intended circuit function, comprising:

first means for generating a sequence of test control signals in accordance with which a circuit device is tested;

a plurality of second means, each of which second means is associated with a respective one of said terminal pins and stores a plurality of electrical stimulas-representative signals for causing the selective application of electrical stimulas signals to said associated respective one of said terminal pins in response to a test control signal generated by said first means, and sensor means, adapted to be coupled to said associated respective one of said terminal pins, for monitoring a prescribed electrical parameter thereat; and control means for selectively altering said sequence of test control signals in response to an electrical parameter monitored by one of said sensor means.

2. An apparatus according to claim 1, wherein said first means includes memory means in which a series of test control instructions are stored, and said control means comprises address generator means, responsive to a test control instruction in said memory means, for generating a test control signal as an address signal for accessing a test control instruction from said memory means and for accessing a respective electrical stimulas-respective signal for each of said plurality of second means for application to the terminal pins of said circuit device.

3. An apparatus according to claim 2, wherein said address generator means is adapted to be responsive to prescribed outputs of said sensor means in the course of the generation of a test control signal as said address signal.

4. An apparatus according to claim 2, wherein said series of test control instructions stored by said memory means includes first prescribed test control instructions in response to successive ones of which said address generator means is adapted to generate successive test control signals for both addressing that portion of said memory means containing said first prescribed test control instructions and accessing from said second means said electrical stimulus-representative signals.

5. An apparatus according to claim 4, wherein each of said second means includes a terminal pin test control memory adapted to store a plurality of said electrical stimulus-representative signals in respective memory locations thereof, said memory locations being addressable by the address representative test control signals generated by said address generator means.

6. An apparatus according to claim 4, wherein said first means is adapted to be coupled with data processing means, and said series of test control instructions stored by said memory means includes second prescribed test control instructions associated with prescribed data processing operations to be conducted by said data processing means, in response to which data processing operations the addresses of further test control instructions to be accessed from said memory means are defined.

7. An apparatus according to claim 6, wherein said first means further includes means, responsive to the generation of an address signal for accessing one of said second prescribed test control instructions from said memory means, for storing the most recent address representative test control signal generated by said address generator means that defined a memory location in said memory means in which one of said first prescribed test control instructions is stored.

8. An apparatus according to claim 1, wherein each of said second means includes driver circuit means, responsive to said electrical stimulus-representative signals, for controllably generating electrical stimulus signals for application to its associated terminal pin.

9. An apparatus according to claim 8, wherein each of said second means further includes means for establishing the levels of like electrical stimulus signals generated by the driver circuit means of every one of said second means irrespective of differences in inherent electrical characteristics among the driver circuit means.

10. An apparatus according to claim 9, wherein each of said second means includes sensor means, adopted to be coupled to said associated respective one of said terminal pins, for monitoring a prescribed electrical parameter thereat.

11. An apparatus according to claim 10, wherein said establishing means includes means for coupling a varying electrical input to each of said driver circuit means and, in response to the output of said sensor means reaching a prescribed level of one of said like electrical stimulus signals, for storing a signal corresponding to the value of said varying electrical signal for which the output of said sensor means reached said prescribed level.

12. An apparatus according to claim 8, wherein said second means further includes output switch means, coupled to the output of said driver circuit means, for selectively coupling the output of said driver circuit means to its associated terminal pin of said circuit device.

13. An apparatus according to claim 12, wherein said output switch means comprises an MOS transistor the source-drain path of which is coupled between the output of said driver circuit means and said associated terminal pin, and the gate of which is coupled to the output of said driver circuit means.

14. An apparatus according to claim 13, wherein said output switch means further include means, coupled between the gate of said MOS transistor and the output of said driver circuit means, for limiting the voltage coupled said gate relative to the voltage at the output of said driver circuit means.

15. For use with an apparatus for generating electrical stimulas signals to be coupled to an output circuit device, a processor-controlled arrangement for controlling the accessing of instructions from memory, through prescribed operations on which instructions said electrical stimulas signals are generated, comprising:

first means, adapted to be coupled to said output circuit, and comprising a plurality of driver memory means each storing a respective plurality of said electrical stimulas-representative signals for causing the selective application of electrical stimulas signals to said output circuit device; and second means, including a memory unit and responsive to the contents of instructions stored therein, for generating storage access signals and causing said storage access signals to be coupled to both said memory unit for accessing instructions therefrom and to said first means for accessing electrical stimulas-representative signals therefrom for a first mode of operation of said processor, and for generating address signals for accessing instructions from said memory unit that are associated with prescribed data processing operations of said processor, in response to which processing operations the addresses of further instructions to be accessed from said memory unit are defined, for a second mode of operation of said processor.

16. A processor-controlled arrangement according to claim 15, wherein said second means includes means, responsive to said second mode of operation of said processor, for storing the most recent storage access signal generated during said first mode of operation of said processor.

17. A processor-controlled arrangement according to claim 15, wherein each storage access signal generated by said second means is applied in common to each of said memory means.

18. A processor-controlled arrangement according to claim 17, wherein said output circuit device comprises a multiterminal circuit device to the respective terminals of which said electrical stimulus signals are applied for testing said output circuit device.

* * * * *